(12) United States Patent
Kawakami et al.

(10) Patent No.: US 6,362,777 B1
(45) Date of Patent: Mar. 26, 2002

(54) PULSE-DOPPLER RADAR APPARATUS

(75) Inventors: Kenji Kawakami; Hiroshi Ikematsu, both of Tokyo (JP)

(73) Assignee: Mitsubishi Denski Kabushiki Kaisha, Tokyo (JP)

(*) Notice: Subject to any disclaimer, the term of this patent is extended or adjusted under 35 U.S.C. 154(b) by 0 days.

(21) Appl. No.: 09/580,219

(22) Filed: May 26, 2000

(30) Foreign Application Priority Data

May 28, 1999 (JP) .......................................... 11-150601

(51) Int. Cl.[7] .......................... G01S 13/53; G01S 13/93
(52) U.S. Cl. ........................... 342/131; 342/27; 342/28; 342/70; 342/104; 342/109; 342/118; 342/128; 342/130; 342/195
(58) Field of Search ............................ 342/21, 27, 28, 342/70, 71, 72, 104–118, 120–123, 128–136, 192–197, 202, 59, 89–103, 137

(56) References Cited

U.S. PATENT DOCUMENTS

| | | | |
|---|---|---|---|
| 4,470,049 A | * | 9/1984 | Phaneuf et al. .............. 342/202 |
| 4,827,263 A | * | 5/1989 | Jones et al. .................... 342/59 |
| 5,150,126 A | * | 9/1992 | Knepper et al. ............. 342/137 |
| 6,229,475 B1 | * | 5/2001 | Woolley ....................... 342/93 |

FOREIGN PATENT DOCUMENTS

DE 41 04 907 C1 8/1992

OTHER PUBLICATIONS

"Low Cost GaAs PHEMT MMICs for Millimeter–Wave Sensor Application", H.J. Siweris et al., IEEE MTT–S Digest, 1998, pp. 227–230.
H.J. Siweris et al, IEEE MTT–S Digest, "Low Cost GaAs PHEMT MMICs for Millimeter–Wave Sensor Applications", pp. 227–230 (1998).
Holger H. Meinel, 28th European Microwave Conference Amsterdam, "Automotive Millimeterwave Radar History and present Status", pp. 619–629 (1998).
Heinrich Daembkes et al, 28th European Microwave Conference Amsterdam, "GaAa MMICs for Automotive Applications", pp. 630–635 (1998).

* cited by examiner

Primary Examiner—Bernarr E. Gregory

(57) ABSTRACT

A Pulse-Doppler radar apparatus is constructed such that an output of an oscillator is divided by a distributor and an on/off switch for generating pulses is coupled to an IF input of a first harmonic mixer, in order to improve precision in measurement of a distance and speed.

10 Claims, 6 Drawing Sheets

HIGH-FREQUENCY SIGNAL

TRANSMITTED SIGNAL

SECOND DISTRIBUTED SIGNAL

RECEIVED SIGNAL

BASEBAND SIGNAL (VIDEO SIGNAL)

HIGH-FREQUENCY SIGNAL

TRANSMITTED SIGNAL

LOCALLY GENERATED SIGNAL

RECEIVED SIGNAL

BASEBAND SIGNAL (VIDEO SIGNAL)

PULSE-DOPPLER RADAR APPARATUS

BACKGROUND OF THE INVENTION

1. Field of the Invention

The present invention generally relates to a Pulse-Doppler radar apparatus outputting a pulse wave, receiving a reflected radio wave, and measuring a distance to and/or a speed of a target generating the reflected wave, based on a difference in frequency between the pulse wave and the reflected wave, that is, based on a baseband signal containing a beat frequency component. More particularly, the invention relates to improvements in detection precision of a millimeter wave Pulse-Doppler radar apparatus installed in a mobile object such as an automobile for using a pulse wave in a millimeter band to detect a distance to or a relative speed of a target such as a person, automobile or obstacle around the mobile object.

2. Description of the Related Art

FIG. 7 is a block diagram showing a construction of a related-art Pulse-Doppler radar apparatus or FM pulse Doppler radar apparatus installed in an automobile. Referring to FIG. 7, reference numeral 1 indicates an oscillator for outputting a high-frequency signal corresponding to a preset voltage; 16 indicates a first switch directly connected to an output of the oscillator and switching between outputs of the high-frequency signal; 4 indicates a transmitter amplifier constituting one of the output destinations of the switch 16 and amplifying the high-frequency signal; indicates an antenna; 6 indicates a receiver amplifier for outputting a received signal; 9 indicates a second harmonic mixer constituting the other output destination of the switch 16 and outputting a baseband signal corresponding to a difference between the frequency of the received signal and that of the high-frequency signal; 10 indicates a signal processing part for controlling the preset voltage to the oscillator 1, and for measuring a distance to and/or speed of a target generating the reflected radio wave, based on the baseband signal. Numeral 17 indicates a second switch for selectively connecting the transmitter amplifier 4 or the receiver amplifier 6 to the antenna 5.

A description will now given of the operation according to the related art.

The signal processing part 10 outputs a preset voltage corresponding to a predetermined oscillation frequency to the oscillator 1 so that the oscillator outputs a high-frequency signal corresponding to the preset voltage. When the first switch 16 and the second switch 17 are operated so as to select the transmitter amplifier 4 in this state, a pulse wave based on the amplified high-frequency signal is output from the antenna 5 while the transmitter amplifier 4 remains selected.

When the first switch 16 and the second switch 17 are operated to select the receiver amplifier 6, a signal derived from a radio wave received by the antenna 5, for example, the radio wave reflected by a target of the pulse wave, is input to the receiver amplifier 6. The second harmonic mixer 9 mixes the high-frequency signal with the output of the receiver amplifier 6 so as to produce a baseband signal. The signal processing part 10 measures a distance to and/or a speed of the target generating the reflected wave, based on waveforms of beat frequency components contained in baseband signals obtained in a plurality of detecting processes.

FIGS. 8A–8E are waveform charts generated in a pulse Doppler apparatus according to the related art. FIG. 8A shows a high-frequency signal in a millimeter band output from the oscillator 1; FIG. 8B is a signal output from the transmitter amplifier 4; FIG. 8C shows a locally generated signal output from the first switch 16 to the second harmonic mixer 9; FIG. 8D shows a received signal output from the receiver amplifier 6 to the second harmonic mixer 9; and FIG. 8E shows a baseband signal (video signal) output from the second harmonic mixer 9 to the signal processing part 10.

FIGS. 9A and 9B illustrate the principle of measuring a distance and speed according to the related-art Pulse-Doppler apparatus. Referring to FIGS. 9A and 9B, time is plotted horizontally and frequency is plotted vertically. Curve d indicates a waveform of a transmitted signal; curve e indicates a waveform of a received signal; and curve f indicates a waveform of the video signal frequency produced when the frequency of the baseband signal (video signal) shown in FIG. 8E is plotted on the time axis. ΔF indicates a modulation frequency component of the pulse wave (the transmitted signal shown in FIG. 8B), and Fb indicates a frequency component, called a beat frequency component, of the baseband signal (video signal). In order to simplify the illustration, FIGS. 9A and 9B show waveforms having the relative speed of zero.

By repeating measurements of the pulse waves during a period of a lump of a prescribed number of pulses of the high-frequency signal (pulse wave), data of the curve f for a period of the lump is obtained. Based on a waveform of the curve f, the signal processing part 10 can measure the distance to and the speed of the target generating the reflected wave.

FIG. 10 is a block diagram showing a construction of the related-art Pulse-Doppler radar apparatus in which improvement is made. This construction is disclosed in, for example, "IEEE MTT-S Digest, pp.227–230 (1998)" and in "European Microwave Conference Amsterdam, pp619–629 and 630–635 (1998)". Referring to FIG. 10, numeral 18 indicates a frequency-multiplier disposed between the first switch 16 and the transmitter amplifier 4. With this construction, the oscillation frequency of the oscillator 1 may be half that of the output frequency, which is useful particularly when the high-frequency signal in a millimeter band is used.

In the above-described construction of the related-art Pulse-Doppler radar apparatus, the load impedance of the oscillator 1 varies to produce a momentary open state when the first switch 16 is operated for switching. As a result of this variation in the load, the oscillation frequency of the oscillator 1 varies. FIG. 11 is a graph showing the relationship between the load impedance of the oscillator 1 and the oscillation frequency under the condition of a constant preset voltage. Referring to FIG. 11, the load impedance is plotted horizontally and the oscillation frequency is plotted vertically. FIG. 11 shows that, when the load impedance of the oscillator 1 varies, for example, from 50 Ω to a momentary open-state level, such a load variation causes the oscillation frequency of the oscillator 1 to vary significantly.

As a result of this, a variation in the oscillation frequency resulting from switching is included in the pulse wave so that the beat frequency component obtained at each point along the time line varies. It leads to disturbance in the waveform of the beat frequency component obtained a plurality of measurements. Thus, the precision in measurement of the distance and speed cannot be improved beyond a certain level.

SUMMARY OF THE INVENTION

Accordingly, a general object of the present invention is to provide a Pulse-Doppler radar apparatus in which the aforementioned problem is eliminated.

Another and more specific object of the present invention is to provide a Pulse-Doppler radar apparatus in which the load impedance variation of the oscillator is appropriately controlled so that the distance to and/or speed of a target can be measured with high precision incapable in the related art.

The aforementioned objects are achieved by a Pulse-Doppler radar apparatus comprising: an antenna; an oscillator for outputting a high-frequency signal corresponding to a preset voltage; a distributor connected to an output of the oscillator so as to divide the high-frequency signal into a first distributed signal and a second distributed signal; a first mixer supplied at one of its two input terminals with the first distributed signal and outputting a transmitted signal of twice the frequency as that of the first distributed signal on application of a dc voltage to the other input terminal; a transmission and reception unit for outputting a pulse wave in response to the transmitted signal via the antenna and outputting a received signal based on the corresponding reflected wave received by the antenna; a second harmonic mixer supplied at one of its two input terminals with the second distributed signal, supplied at the other input terminal with the received signal, and outputting a baseband signal based on the second distributed signal and the received signal; and a signal processing unit outputting the preset voltage to the oscillator, outputting the dc voltage to the first harmonic mixer, and measuring a distance to and/or speed of a target generating the reflected wave, based on the baseband signal.

The aforementioned objects can also be achieved by a Pulse-Doppler radar apparatus comprising: an antenna; an oscillator for outputting a high-frequency signal corresponding to a preset voltage; a distributor connected to an output of the oscillator so as to divide the high-frequency signal into a-first distributed signal and a second distributed signal; a multiplier for receiving the first distributed signal and outputting a transmitted signal having twice the frequency as that of the first distributed signal; a transmission and reception unit for outputting a pulse wave in response to the transmitted signal via the antenna, and outputting a received signal based on the corresponding reflected wave received by the antenna; a second harmonic mixer supplied at one of its two input terminals with the second distributed signal and, at the other input terminal, with the received signal, and for outputting a baseband signal based on the second distributed signal and the received signal; and a signal processing unit outputting the preset voltage to the oscillator, and measuring a distance to and/or speed of a target generating the reflected wave based on the baseband signal.

The transmission unit may comprise: a transmitter amplifier for amplifying the transmitted signal and supplying the same to the antenna; a receiver amplifier for amplifying a signal derived from the reflected wave received by the antenna and outputting the corresponding received signal; and a switch for selectively connecting one of the transmitter amplifier and receiver amplifier, to the antenna, wherein the signal processing unit controls operation of the switch.

The transmission and reception unit may comprise: a transmitter amplifier for amplifying the transmitted signal and supplying the same to the antenna; a receiver amplifier for amplifying a signal derived from the reflected wave received by the antenna and outputting the corresponding received signal; and a circulator for selectively connecting one of the transmitter amplifier and receiver amplifier, to the antenna.

The transmission and reception unit may comprise: an amplifier for amplifying an input signal; a two-input switch connected to an input of the amplifier and having two input terminals, one of the input terminals receiving the transmitted signal: a two-output switch connected to an output of the amplifier and having two output terminals, one of the output terminals being connected to the second harmonic mixer; and a circulator connected to the other output terminal of the two-output switch, the other input terminal of the two-input switch and the antenna, and selectively connecting the antenna to one of: the other output terminal of the two-output switch; and the other input terminal of the two-input switch, wherein the signal processing unit controls operation of the two-input switch and two-output switch.

The signal processing unit may change the preset voltage for the oscillator with time so that the oscillator outputs a frequency-modulated high-frequency signal with its frequency varying in accordance with the preset voltage.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

First Embodiment

Figure 1:
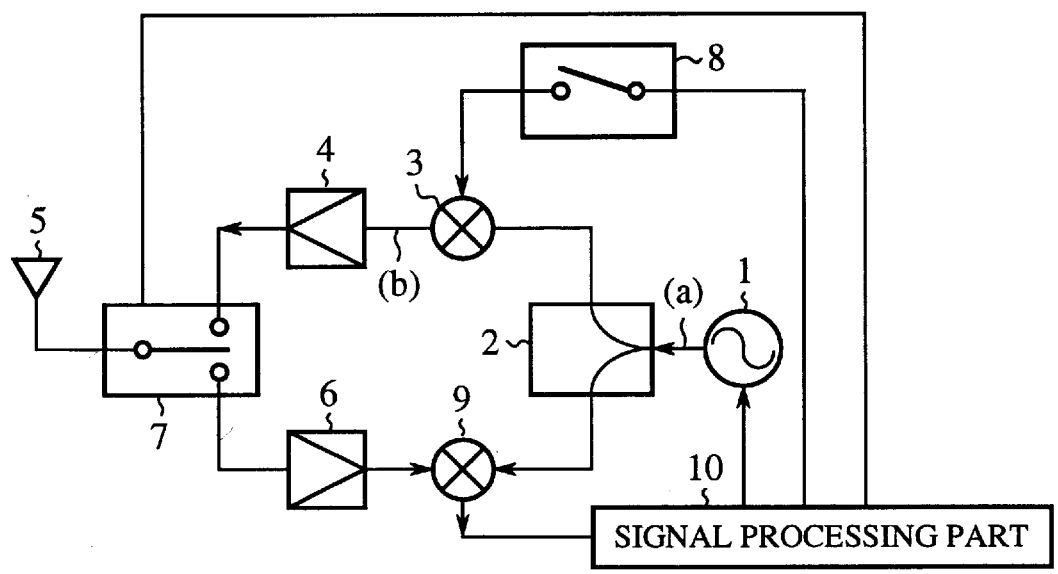
FIG. 1 is a block diagram showing a construction of a Pulse-Doppler radar apparatus according to a first embodiment using a pulse wave in a millimeter band.

FIG. 1 is a block diagram showing a construction of a Pulse-Doppler radar apparatus according to a first embodiment using a pulse wave in a millimeter band. The Pulse- Doppler radar apparatus is installed in a mobile object such as a vehicle and is used to detect a distance to and/or relative speed of a target such as a person, vehicle or obstacle around the mobile object.

Referring to FIG. 1, numeral 1 indicates an oscillator for outputting a high-frequency signal corresponding to a preset voltage; 2 indicates a distributor connected to an output of the oscillator 1 and divides the high-frequency signal into a first distributed signal and a second distributed signal; 3 indicates a first harmonic mixer (first mixer) supplied at one of its two inputs terminals with the first distributed signal, and supplied at the other input terminal with a dc voltage so as to output a transmitted signal having twice the frequency as the first distributed signal; 4 indicates a transmitter amplifier for amplifying the transmitted signal; 5 indicates an antenna for outputting a pulse wave corresponding to the amplified transmitted signal and receiving the reflected wave derived from the pulse wave; 6 indicates a receiver amplifier for amplifying a signal derived from the reflected wave and outputting a received signal; 7 indicates a switch for selectively connecting the transmitter amplifier 4 or the receiver amplifier 6 to the antenna 5. Numeral 8 indicates an on/off switch for setting a duration of a dc voltage applied to the second input terminal of the harmonic mixer 3.

Numeral 9 indicates a second harmonic mixer (second mixer) supplied at one of its two input terminals with the second distributed signal, and supplied at the other input terminal with the received signal so as to output a baseband signal derived from the second distributed signal and the received signal; 10 indicates a signal processing part for determining a preset voltage for the oscillator 1, a duration of the ON period of the on/off switch 8, for timing the operation of the switch 7, and for measuring the distance to and/or speed of the target generating the reflected wave, based on the baseband signal. A generic term of signal processing unit may be used to refer to a combination comprising the on/off switch 8 and the signal processing part.

A description will now be given of the operation of the Pulse-Doppler radar apparatus according to the first embodiment.

The signal processing part 10 outputs a preset voltage corresponding to a predetermined frequency to the oscillator 1 so that the oscillator 1 outputs a high-frequency signal corresponding to the preset voltage. The distributor 2 divides the high-frequency signal into the first distributed signal and the second distributed signal.

The signal processing part 10 places the on/off switch 8 in an ON state to apply the predetermined dc voltage to the second input mi terminal of the harmonic mixer 3 during the ON period of the on/off switch 8. During this ON period, the first harmonic mixer 3 outputs a transmitted signal having a millimeter-band frequency twice as high as that of the first distributed signal. The transmitter amplifier 4 amplifies the transmitted signal. The switch 7 is controlled by the signal processing part 10 in synchronization with the on/off switch 8. The switch 7 connects the transmitter amplifier 4 to the antenna 5 during the ON period of the on/off switch 8. The antenna 5 outputs the pulse wave corresponding to the amplified transmitted signal in blocks, each block lasting as long as the ON period.

When the on/off switch 8 is placed in an OFF state, the switch 7 synchronically connects the receiver amplifier 6 to the antenna 5. In this state, a radio wave received by the antenna 5, for example the radio wave reflected by a target of the pulse wave, is input to the receiver amplifier 6. The receiver amplifier 6 amplifies the incoming signal so as to output the corresponding received signal. Since the second distributed signal output from the second distributor 2 is input to the first input terminal of the second-harmonic mixer 9, the second harmonic mixer 9 mixes the received signal with the second distributed signal responsive to the output of the received signal from the receiver amplifier 6. The second harmonic mixer 9 then outputs a baseband signal. Based on the baseband signal, the signal processing part 10 measures the distance to and/or speed of a target generating the reflected wave.

The first harmonic mixer 3 in the first embodiment is called an even harmonic mixer for mixing an local oscillator (LO) wave and an IF signal so as to output the sum frequency component derived from the second harmonic of the LO signal and the IF signal. If the IF signal is composed of a DC component, the frequency component output from the even harmonic mixer has a frequency twice as high as that of the LO wave. If the IF signal is not mixed, the bi-harmonic frequency component of the LO wave is not output. In contrast, if the IF signal is not mixed in a fundamental harmonic mixer, the LO signal is leaked to the output so that the pulse wave with a sufficient on/off ratio cannot be generated.

Figure 2A:
FIGS. 2A–2E are waveform charts produced by the Pulse-Doppler radar apparatus according to the first embodiment.
Figure 2B:
Figure 2C:
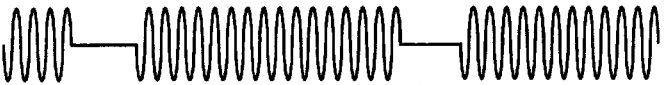
Figure 2D:
Figure 2E:
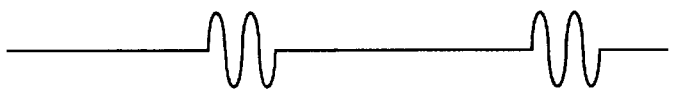

FIGS. 2A–2E are waveform charts generated by the Pulse-Doppler radar apparatus according to the first embodiment. FIG. 2A is a chart for the high-frequency signal output from the oscillator 1; FIG. 2B is a chart for the transmitted signal with a millimeter band frequency output from the transmitter amplifier 4; FIG. 2C is a chart for the second distributed signal (alternatively referred to as a locally generated signal) output from the distributor 2 to the second harmonic mixer 9; FIG. 2D is a chart for the received signal output from the receiver amplifier 6 to the second harmonic mixer 9; and FIG. 2E is a chart for the baseband signal (video signal) output from the second harmonic mixer 9-to the signal processing part 10.

Figure 3A:
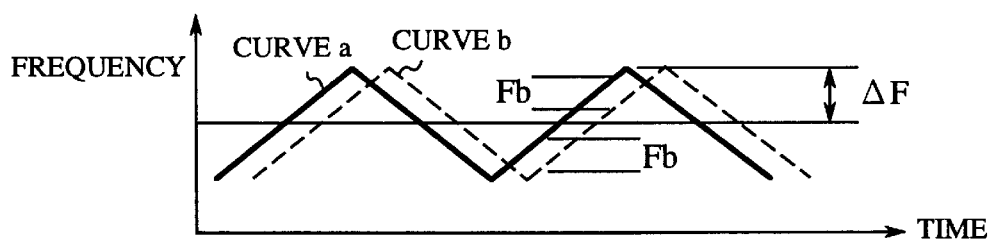
FIGS. 3A and 3B are illustrations of the principle of the Pulse-Doppler radar apparatus according to the first embodiment.
Figure 3B:
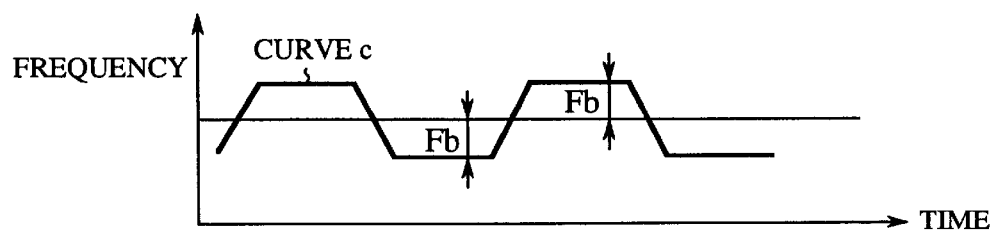

FIGS. 3A and 3B are illustrations of the principle of the Pulse-Doppler radar apparatus according to the first embodiment. Referring to FIGS. 3A and 3B, time is plotted horizontally and frequency is plotted vertically. Curve a indicates a waveform of the transmitted signal obtained by plotting, on the time axis, the frequency of the pulse wave (transmitted signal (b)) output at relevant points of time; curve b indicates a waveform of the received signal obtained by plotting, on the time axis, the frequency of the reflected wave derived from the pulse wave and incoming at relevant points of time; and curve c indicates a waveform of the video signal obtained by plotting, on the time axis, the frequency of the baseband signal (video signal) output from the second harmonic mixer 9 at relevant points of time. ΔF indicates a modulation frequency component of the pulse wave (the transmitted signal (b)), and Fb indicates a beat frequency component of the baseband signal (video signal) (e). In order to simplify the illustration, FIGS. 3A and 3B show waveforms having the relative speed of zero.

As shown in FIGS. 3A and 3B, the frequency of the high-frequency signal output from the oscillator 1 inducing that of the pulse wave is made to vary with time so that the frequency of the pulse wave varies within a period of a lump of a prescribed number of pulses. By operating the on/off switch 8 at a high speed, the baseband signal (video signal) (e), containing at relevant points of time the beat frequency component derived from the difference between the transmitted signal (high-frequency signal) and the received signal, is obtained. By repeating measurements for a period of the lump of the high-frequency signal (pulse wave), data for a period of the curve c is obtained. Such frequency modulation (FM) of the high-frequency signal output from the oscillator 1 in a series of lumps can be achieved by temporal variation of the preset voltage supplied from the signal processing part 10 to the oscillator 1.

As the distance to the target increases, there increases a delay of the reflected wave. Consequently, curve c varies such that the beat frequency component increases. Further, curve c varies so as to contain shorter period of time characterized by a constant beat frequency component. As the speed difference with respect to the target increases, the magnitude of Doppler shift is increased. This shortens the interval between curves b and a so that curve c varies leading to reduction of the beat frequency component. Thus, the signal processing part 10 is capable of measuring the distance to and speed of a target generating the reflected wave, based on the waveform of curve c. It is noted that the received signal is delayed by twice the transit time as that of the distance to the target.

When the Pulse-Doppler radar apparatus is used as a Pulse-Doppler radar, frequency modulation in the oscillator 1 is not performed. Instead, only pulse modulation in the transmission system is performed. The target is irradiated by the pulse-modulated signal so that the relative distance to the target is calculated, based on the time of arrival of a signal derived from the reflected wave. The relative speed is known by a variation in the relative distance along the time line.

As has been described, according to the first embodiment, the transmission and reception unit comprises the transmitter amplifier 4 for amplifying the transmitted signal and supplying the same to the antenna 5, the receiver amplifier 6 for amplifying the signal derived from the reflected wave received by the antenna 5 and outputting the received signal, and the switch 7 for selectively connecting the transmitter amplifier 4 or the receiver amplifier 6 to the antenna 5. This construction provides the advantage that the pulse wave is output from the transmission and reception unit merely by controlling operation of the switch 7 through the signal processing part 10.

In further accordance with the first embodiment, the apparatus comprises: the antenna 5; the oscillator 1 for outputting a high-frequency signal corresponding to a preset voltage; the distributor 2 connected to an output of the oscillator 1 so as to divide the high-frequency signal into the first distributed signal and the second distributed signal; the first harmonic mixer 3 supplied at one of its two input terminals with the first distributed signal and outputting a transmitted signal having twice the frequency as that of the first distributed signal on application of a dc voltage to the other input terminal; the transmission and reception unit for outputting a pulse wave corresponding to the transmitted signal via the antenna 5 and supplied with the corresponding reflected wave received by the antenna 5 so as to output a received signal; the second harmonic mixer 9 supplied at one of its two input terminals with the second distributed signal, supplied at the other input terminal with the received signal, and outputting a baseband signal, based on the second distributed signal and the received signal; and the signal processing part 10 outputting the preset voltage to the oscillator 1, outputting the dc voltage to the first harmonic mixer 3, and measuring the distance to and/or speed of a target generating the reflected wave based on the baseband signal. In this construction, the oscillator 1 is directly connected to the distributor 2 so that the high-frequency signal output from the oscillator 1 is divided into the first distributed signal and the second distributed signal without switching.

In further accordance with this construction, the pulse wave can be output from the transmission and reception unit by controlling the duration of output of the pulse wave through the switch 7 in response to the transmitted signal, and by controlling the duration of input of the dc voltage to the first harmonic-mixer 3 through the on/off switch 8. Although the on/off switch 8 and the switch 7 are used in the aforementioned control, it is ensured that the oscillator 1 is isolated from the switches 7 and 8, by disposing the first harmonic mixer 3 and the distributor 2 between the oscillator 1 and the switches 7/8. Therefore, a variation in the load impedance of the oscillator 1 due to switching operation of the switches 7 and 8 is appropriately controlled.

The load impedance of the oscillator 1 remains unaffected by the switching operation. Even when the switches 7 and 8 are put in an open state momentarily, the oscillation frequency does not vary. In the related art, a variation in the oscillation frequency resulting from switching is included in the pulse wave, thus causing the beat frequency component at relevant points of time to vary. Associated with this, the waveform of the beat frequency component obtained in a plurality of measurements of the beat frequency component is disturbed. Therefore, precision in measuring the distance and speed cannot be improved beyond a certain level. According to the first embodiment, however, such a disturbance in the waveform of the beat frequency component is eliminated. The precision in measuring the distance to and speed of a target by using the pulse wave is improved beyond the level available in the related art.

The related-art switch connected to the oscillator 1 should be designed for use in a high frequency range. Such a switch in a millimeter band must be implemented by an excessively expensive monolithic microwave integrated circuit (MMIC) element. The first embodiment replaces the related-art switch with a passive circuit embodied by the distributor 2. Thus, the apparatus can be manufactured on a relatively inexpensive substrate so that the cost of manufacturing is reduced.

In further accordance with the first embodiment, the signal processing part 10 changes the preset voltage for the oscillator 1 with time. Accordingly, the oscillator 1 outputs the frequency-modulated high-frequency signal with its frequency varying in accordance with the preset voltage. Thus, the apparatus can be used as a frequency-modulated pulse radar.

Second Embodiment

Figure 4:
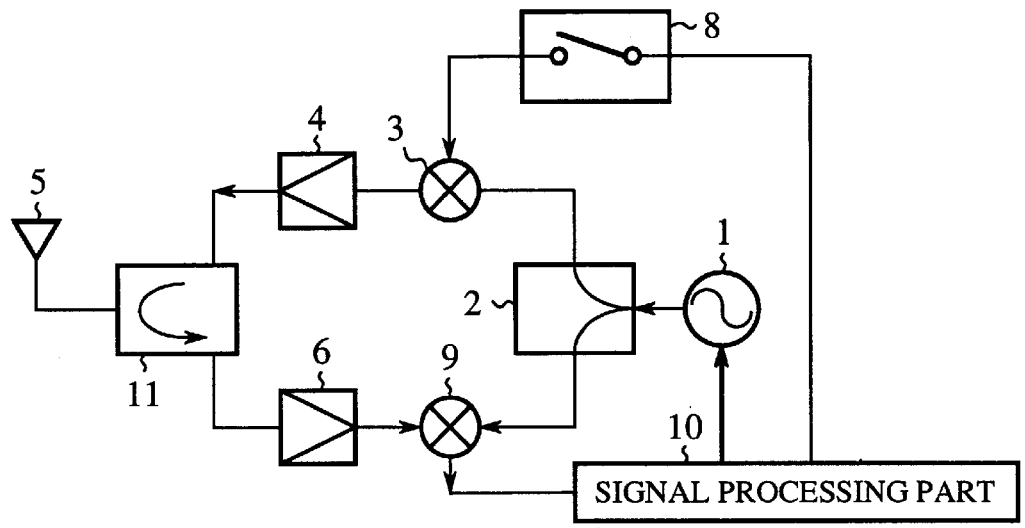
FIG. 4 is a block diagram showing a construction of a Pulse-Doppler radar apparatus using a millimeter band pulse wave according to a second embodiment of the present invention.

FIG. 4 is a block diagram showing a construction of a Pulse-Doppler radar apparatus using a millimeter band pulse wave according to a second embodiment of the present invention. Referring to FIG. 4, numeral 11 indicates a circulator for selectively connecting the transmitter amplifier 4 or the receiver amplifier 6 to the antenna 5. The remaining aspects of the construction are the same as the corresponding aspects of the first embodiment, and the description thereof is omitted.

A description will now be given of the operation according to the second embodiment.

The circulator 11 alternately connects the transmitter amplifier 4 and the receiver amplifier 6 to the antenna 5. The signal processing part 10 controls the on/off switch 8 to place it in an ON state while the circulator 11 connects the transmitter amplifier 4 to the antenna 5. With this, a transmitted signal of twice the frequency as that of the output frequency of the oscillator 1 is input to the antenna 5 via the transmitter amplifier 4 and the circulator 11. Responsive to this, the antenna 5 outputs a pulse wave corresponding to the transmitted signal.

When the reflected wave derived from the pulse wave is input to the antenna 5 while the circulator connects the receiver amplifier 6 to the antenna 5, the receiver amplifier 6 amplifies an incoming signal and outputs corresponding received signal. Based on the received signal the distance to and/or speed of a target generating the reflected wave is measured. The other aspects of the operation according to the second embodiment are the same as the corresponding aspects of the first embodiment and the description thereof is omitted.

As described above, according to the second embodiment, the transmission and reception unit comprises: the transmitter amplifier 4 for amplifying the transmitted signal and supplying the amplified signal to the antenna 5; the receiver amplifier 6 for amplifying the signal derived from the reflected wave received by the antenna 5 so as to output the corresponding received signal; and the circulator 11 for selectively connecting the transmitter amplifier 4 or the receiver amplifier 6 to the antenna 5. Thus, the pulse wave can be output from the transmission and reception unit by operating the circulator 11.

Third Embodiment

Figure 5:
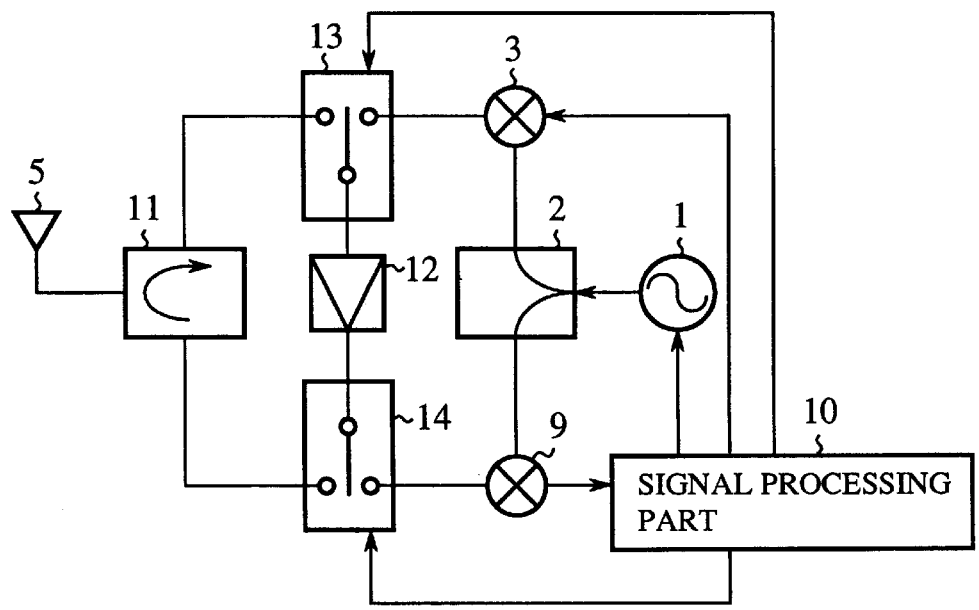
FIG. 5 is a block diagram showing a construction of a Pulse-Doppler radar apparatus using a pulse wave in a millimeter band according to a third embodiment.

FIG. 5 is a block diagram showing a construction of a Pulse-Doppler radar apparatus using a pulse wave in a millimeter band according to a third embodiment. Referring to FIG. 5, numeral 12 indicates an amplifier for amplifying an incoming signal; 13 indicates a two-input switch connected to an input of the amplifier 12 and having two input terminals, one being connected to the harmonic mixer 3, and the other being connected to the circulator 11; 14 indicates a two-output switch connected to an output of the amplifier 12 9 and having two output terminals, one being connected to the second harmonic mixer 9 and the other being connected to the circulator 11. The two-input switch 13 and the two-output switch 14 are supplied with relevant switching control signals from the signal processing part 10. The other aspects of the third embodiment are the same as the corresponding aspects of the second embodiment and the description thereof is omitted.

A description will now be given of the operation according to the third embodiment.

While the circulator 11 connects the two-output switch 14 to the antenna 5, the signal processing part 10 connects the two-input switch 13 to the first harmonic mixer 3 and connects the two-output switch 14 to the circulator 11. The transmitted signal having its frequency converted by the first harmonic mixer 3 into a frequency twice as high as the output frequency of the oscillator 1, is input to the antenna 5 via the two-input switch 13, the amplifier 12, the two-output switch 14 and circulator 11. The antenna 5 outputs the pulse wave corresponding to the transmitted signal.

While the circulator 11 connects the two-input switch 13 to the antenna 5, the signal processing part 10 connects the two-output switch 14 to the second harmonic mixer 9 and connects the two-input switch 13 to the circulator 11. When the reflected wave derived from the pulse wave is input to the antenna 5 while the circulator 11 connects the two-input switch 13 to the antenna 5, the received signal is input to the second harmonic mixer 9 via the circulator 11, the two-input switch 13, the amplifier 12 and the two-output switch 14 so that the signal processing part 10 measures the distance to and/or speed of a target generating the reflected wave. The other aspects of the operation according to the third embodiment are the same as the corresponding aspects of the second embodiment and the description thereof is omitted.

As has been described, the apparatus according to the third embodiment comprises: the amplifier 12 for amplifying the input signal; the two-input switch 13 connected to the input of the amplifier 12 and having two input terminals, one of the input terminals receiving the transmitted signal; the two-output switch 14 connected to the output of the amplifier 12 and having two output terminals, one of the output terminals being connected to the second harmonic mixer 9; and the circulator 11 connected to the other output terminal of the two-output switch 14, the other input terminal of the two-input switch 13 and the antenna 5, and selectively connecting the antenna 5 to the other output terminal of the two-output switch 14 or the other input terminal of the two-input switch 13. This construction provides the advantage that the pulse wave is output from the antenna 5 merely by controlling operation of both the two-input switch 13 and the two-output switch 14 through the signal processing part 10.

Another advantage is that the single amplifier 12 is used to amplify the transmitted signal and the received signal.

Fourth Embodiment

Figure 6:
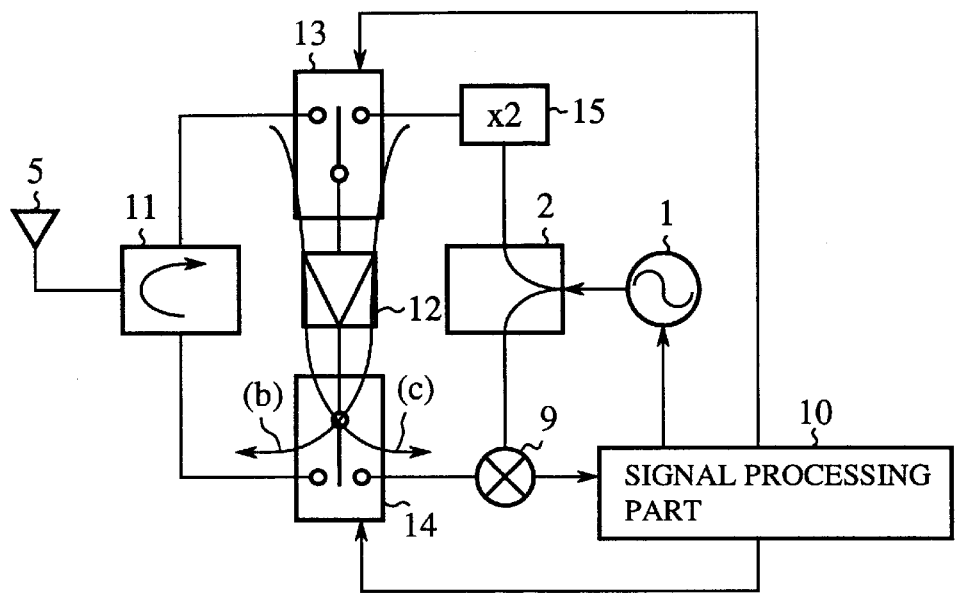
FIG. 6 is a block diagram showing a construction of a Pulse-Doppler radar apparatus using a millimeter band pulse wave according to a fourth embodiment of the present invention.
Figure 7:
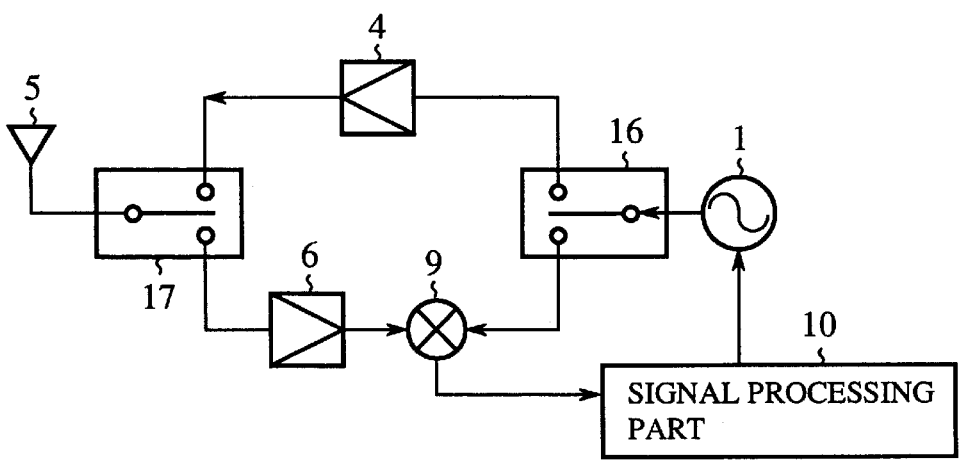
FIG. 7 is a block diagram showing a construction of a related-art Pulse-Doppler radar apparatus or FM pulse Doppler radar apparatus installed in an automobile.
Figure 8A:
FIGS. 8A–8E are waveform charts generated in a pulse Doppler apparatus according to the related art.
Figure 8B:
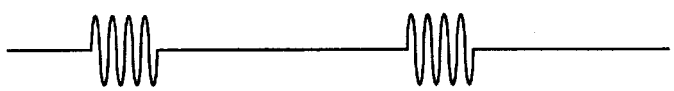
Figure 8C:
Figure 8D:
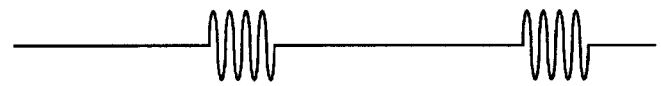
Figure 8E:
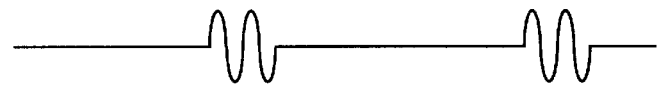
Figure 9A:
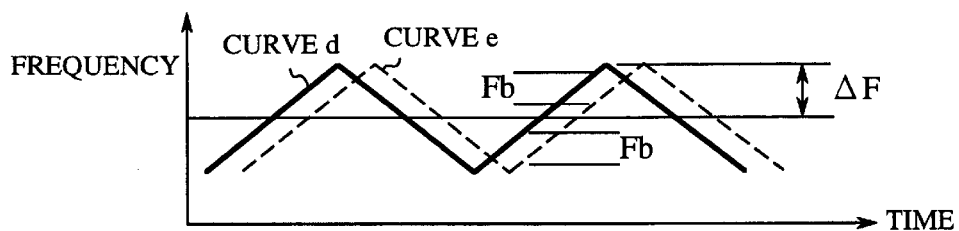
FIGS. 9A and 9B. Illustrate the principle of measuring a distance and speed according to the related-art Pulse-Doppler apparatus.
Figure 9B:
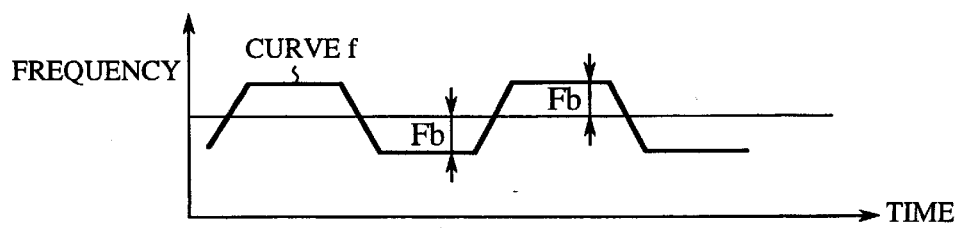
Figure 10:
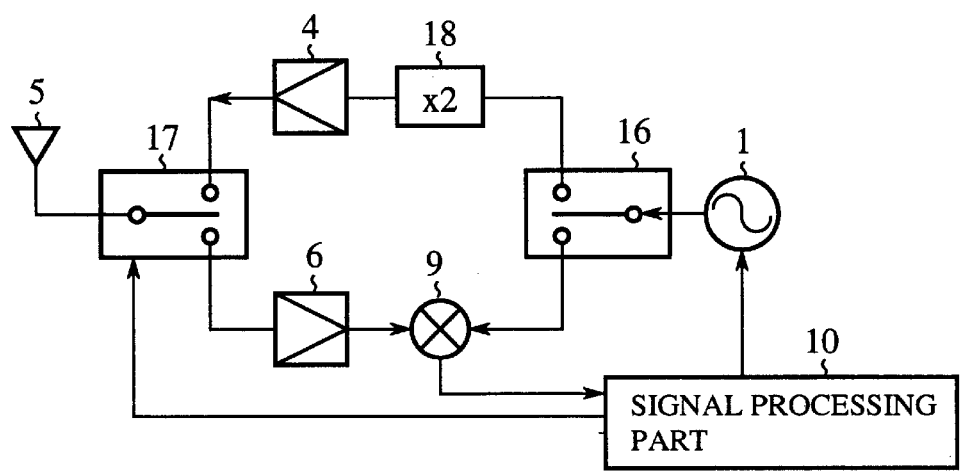
FIG. 10 is a block diagram showing a construction of the related-art Pulse-Doppler radar apparatus in which an improvement is made.
Figure 11:
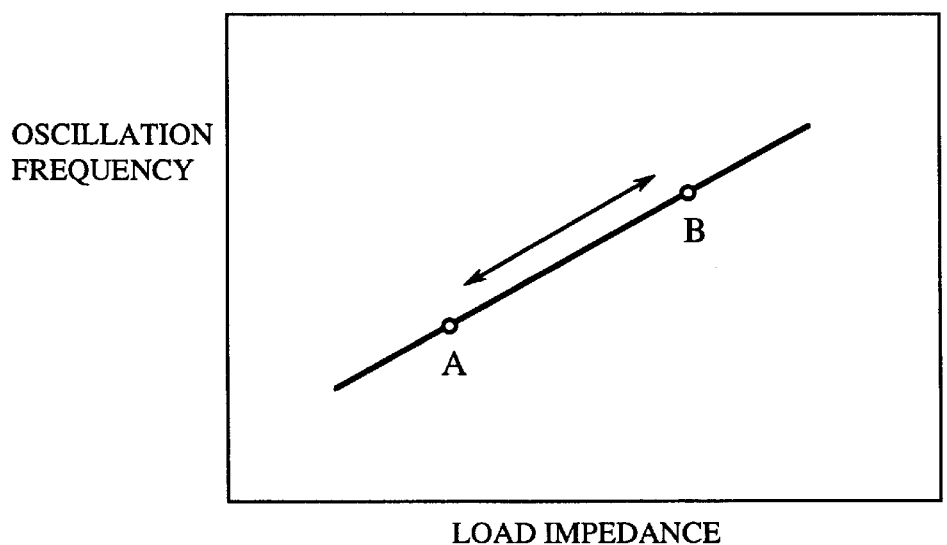
FIG. 11 is a graph showing a relationship between the load impedance of the oscillator 1 and the oscillation frequency under the condition of a constant preset voltage.

FIG. 6 is a block diagram showing a construction of a Pulse-Doppler radar apparatus using a millimeter band pulse wave according to a fourth embodiment of the present invention. Referring to FIG. 6, numeral 15 indicates a multiplier for receiving the first distributed signal and outputting a transmitted signal having a frequency twice as high as the first distributed signal. The other aspects of the construction are the same as the corresponding aspects of the third embodiment and the description thereof is omitted.

A description will now be given of the operation according to the fourth embodiment.

While the circulator 11 connects the two-output switch 14 to the antenna 5, the signal processing part 10 connects the two-input switch 13 to the first multiplier 15 and connects the two-output switch 14 to the circulator 11. The transmitted signal having its frequency converted by the multiplier 15 into a frequency twice as high as the output frequency of the oscillator 1 is input to the antenna 5 via the two-input switch 13, the amplifier 12, the two-output switch 14 and circulator 11. The antenna 5 outputs the pulse wave corresponding to the transmitted signal.

While the circulator 11 connects the two-input switch 13 to the antenna 5, the signal processing part 10 connects the two-output switch 14 to the second harmonic mixer 9 and connects the two-input switch 13 to the circulator 11. When the reflected wave derived from the pulse wave is received by the antenna while the circulator 11 connects the two-input switch 13 to the antenna 5, the received signal is input to the second harmonic mixer 9 via the circulator 11, the two-input switch 13, the amplifier 12 and the two-output switch 14 so that the signal processing part 10 measures the distance to and/or speed of a target generating the reflected wave. The other aspects of the operation according to the fourth embodiment are the same as the corresponding aspects of the third embodiment and the description thereof is omitted.

In accordance with the fourth embodiment, the apparatus comprises: the antenna 5; the oscillator 1 for outputting a high-frequency signal corresponding to a preset voltage; the distributor 2 connected to an output of the oscillator 1 so as to divide the high-frequency signal into the first distributed signal and the second distributed signal; the multiplier 15 for receiving the first distributed signal and outputting a transmitted signal having a frequency twice as high as the first distributed signal; the transmission and reception unit for outputting a pulse wave corresponding to the transmitted signal via the antenna 5 and supplied with the corresponding reflected wave received by the antenna 5 so as to output the corresponding received signal; the second harmonic mixer 9 supplied at one of its two input terminals with the second distributed signal, supplied at the other input terminal with the received signal, and outputting a baseband signal based on the second distributed signal and the received signal; and the signal processing part 10 outputting the preset voltage to the oscillator 1, and measuring the distance to and/or speed of a target generating the reflected wave, based on the baseband signal. In this construction, the oscillator 1 is directly connected to the distributor 2 so that the high-frequency signal output from the oscillator 1 is divided into the first distributed signal and the second distributed signal without switching.

This construction provides the advantage that the pulse wave is output from the transmission and reception unit by controlling the duration of output of the pulse wave through the two-input switch 13 and the two-output switch 14 of the transmission and reception switch in response to the transmitted signal. These are controlled still by the two-input switch 13 and the two-output switch 14. However, by disposing at least the multiplier 15 and the distributor 2 between the oscillator 1 and the two-input switch 13 and disposing at least the second harmonic mixer 9 and the distributor 2 between the oscillator 1 and the two-output switch 14, it is ensured that the oscillator 1 is isolated from the switches. Therefore, a variation in the load impedance of the oscillator 1 due to switching operation of the switches 13 and 14 is appropriately controlled.

Accordingly, the load impedance of the oscillator 1 remains unaffected by the switching operation. Even when the switches 13 and 14 are placed in an open state momentarily, the oscillation frequency does not vary substantially. In the related art, a variation in oscillation frequency resulting from switching is included in the pulse wave, thus causing the beat frequency component at relevant points of time to vary. Associated with this, the waveform of the beat frequency component obtained in a plurality of measurements of the beat frequency component is disturbed. Therefore, the precision in measuring the distance and speed cannot be improved beyond a certain level. According to the fourth embodiment, however, such a disturbance in the waveform of the beat frequency component is eliminated. The precision in measuring the distance to and speed of a target by using the pulse wave is improved beyond the level available in the related art.

The various advantages provided by the present invention will be listed below.

In accordance with one aspect of the invention, the apparatus comprises: the antenna; the oscillator for outputting a high-frequency signal corresponding to a preset voltage; the distributor connected to an output of the oscillator so as to divide the high-frequency signal into the first distributed signal and the second distributed signal; the first mixer supplied at one of its two input terminals with the first distributed signal, and outputting a transmitted signal having twice the frequency as that of the first distributed signal on application of a dc voltage to the other input terminal; the transmission and reception unit for outputting a pulse wave corresponding to the transmitted signal via the antenna and supplied with the corresponding reflected wave received by the antenna so as to output a received signal; the second mixer supplied at one of its two input terminals with the second distributed signal, supplied at the other input terminal with the received signal, and outputting a baseband signal based on the second distributed signal and the received signal; and the signal processing unit outputting the preset voltage to the oscillator, outputting the dc voltage to the first mixer, and measuring the distance to and/or speed of a target generating the reflected wave, based on the baseband signal. In this construction, the oscillator is directly connected to the distributor so that the high-frequency signal output from the oscillator is divided into the first distributed signal and the second distributed signal without switching.

Such a construction also permits outputting of the pulse wave from the transmission and reception unit by allowing the transmission and reception unit to control the duration of output of the pulse wave in response to the transmitted signal, and to control the duration of input of the dc voltage to the first mixer. The on/off switch and the like are still to be used in these controls.

However, by disposing the first mixer and the distributor between the oscillator and the switches, it is ensured that the oscillator is isolated from the switches. Therefore, variation in the load impedance of the oscillator due to switching operation of the switches is appropriately controlled.

Accordingly, the load impedance of the oscillator remains unaffected by the switching operation. Even when the switches are placed in an open state momentarily, the oscillation frequency does not vary substantially. In the related art, a variation in oscillation frequency resulting from switching is included in the pulse wave, thus causing the beat frequency component at relevant points of time to vary. Associated with this, the waveform of the beat frequency component obtained in a plurality of measurements of the beat frequency component is disturbed. Therefore, precision in measuring the distance and speed cannot be improved beyond a certain level. According to the invention, however, such a disturbance in the waveform of the beat frequency component is eliminated. The precision in measuring the distance to and speed of a target by using the pulse wave is improved beyond a level available in the related art.

In accordance with another aspect of the present invention, the apparatus comprises: the antenna; the oscillator for outputting a high-frequency signal corresponding to a preset voltage; the distributor connected to an output of the oscillator so as to divide the high-frequency signal into the first distributed signal and the second distributed signal: the multiplier for receiving the first distributed signal and outputting a transmitted signal having twice the frequency as the first distributed signal; the transmission and reception unit for outputting a pulse wave corresponding to the transmitted signal via the antenna and supplied with the corresponding reflected wave received by the antenna so as to output a received signal; the second mixer supplied at one of its two input terminals with the second distributed signal, supplied at the other input terminal with the received signal, and outputting a baseband signal based on the second distributed signal and the received signal; and the signal processing unit outputting the preset voltage to the oscillator, and measuring the distance to and/or speed of a target generating the reflected wave, based on the baseband signal. In this construction, the oscillator is directly connected to the distributor so that the high-frequency signal output from the oscillator is divided into the first distributed signal and the second distributed signal without switching.

Such a construction also permits outputting of the pulse wave from the transmission and reception unit by allowing the transmission and reception unit to control the duration of output of the pulse wave in response to the transmitted signal. By disposing at least the multiplier and the distributor between the oscillator and the switches for effecting these controls, it is ensured that the oscillator is isolated from the switches. Therefore, a variation in the load impedance of the oscillator due to switching operation of the switches is appropriately controlled.

Accordingly, the load impedance of the oscillator remains unaffected by the switching operation. Even when the switches are placed in an open state momentarily, the oscillation frequency does not vary. In the related art, a variation in oscillation frequency resulting from switching is included in the pulse wave, thus causing the beat frequency component at relevant points of time to vary. Associated with this, the waveform of the beat frequency component obtained in a plurality of measurements of the beat frequency component is disturbed. Therefore, precision in measuring the distance and speed cannot be improved beyond a certain level. According to the invention, however, such a disturbance in the waveform of the beat frequency component is eliminated. The precision in measuring the distance to and speed of a target by using the pulse wave is improved beyond he level available in the related art.

In accordance with still another aspect of the present invention, the transmission and reception unit comprises the transmitter amplifier for amplifying the transmitted signal and supplying the same to the antenna, the receiver amplifier for amplifying the signal derived from the reflected wave received by the antenna and outputting the received signal, and the switch for selectively connecting the transmitter amplifier or the receiver amplifier to the antenna. This construction provides the advantage that the pulse wave is output from the transmission and reception unit merely by controlling operation of the switch through the signal processing unit.

In accordance with still another aspect of the present invention, the transmission and reception unit comprises: the transmitter amplifier for amplifying the transmitted signal and supplying the amplified signal to the antenna; the receiver amplifier for amplifying the signal derived from the reflected wave received by the antenna so as to output the corresponding received signal; and the circulator for selectively connecting the transmitter amplifier or the receiver amplifier to the antenna. Thus, the pulse wave can be output from the transmission and reception unit by operating the circulator.

In accordance with still another aspect of the present invention,,the transmission and reception unit comprises: the amplifier for amplifying the input signal; the two-input switch connected to the input of the amplifier and having two input terminals, one of the input terminals receiving the transmitted signal; the two-output switch connected to the output of the amplifier and having two output terminals, one of the output terminals being connected to the second mixer; and the circulator connected to the other output terminal of the two-output switch, the other input terminal of the two-input switch and the antenna, and selectively connecting the antenna to the other output terminal of the two-output switch or the other input terminal of the two-input switch. This construction provides the advantage that the pulse wave is output from the transmission and reception unit merely by selectively controlling operation of the two-input switch and of the two-output switch by using the signal processing unit. Another advantage is that only the single amplifier is used to amplify the transmitted signal and the received signal.

In accordance with yet another aspect of the present invention, the signal processing unit changes the preset voltage for the oscillator with time. Accordingly, the oscillator outputs the frequency-modulated high-frequency signal with its frequency varying in response to the preset voltage. Thus, the apparatus can be used as a frequency-modulated pulse radar.

The present invention is not limited to the these embodiments, and variations and modifications may be made without departing from the scope of the present invention.

What is claimed is:

1. A Pulse-Doppler radar apparatus comprising:
   an antenna;
   an oscillator for outputting a high-frequency signal corresponding to a preset voltage;
   a distributor connected to an output of said oscillator so as to divide the high-frequency signal into a first distributed signal and a second distributed signal;
   a first mixer supplied at one of its two input terminals with the first distributed signal, and outputting a transmitted signal having twice the frequency as that of the first distributed signal on application of a dc voltage to the other input terminal;
   a transmission and reception unit for outputting a pulse wave corresponding to the transmitted signal via the antenna and outputting a received signal based on a corresponding reflected wave received by said antenna;
   a second mixer supplied at one of its two input terminal with the second distributed signal, supplied at the other input terminal with the received signal, and outputting a baseband signal based on the second distributed signal and the received signal; and
   a signal processing unit outputting the preset voltage to said oscillator, outputting the dc voltage to said first mixer, and measuring at least one of a distance and speed of a target generating the reflected wave, based on the baseband signal.

2. The Pulse-Doppler radar apparatus according to claim 1, wherein said transmission and unit comprises:
   a transmitter amplifier for amplifying the transmitted signal and supplying the same to said antenna;
   a receiver amplifier for amplifying a signal derived from the reflected wave received by the antenna and outputting the corresponding received signal; and
   a switch for selectively connecting one of said transmitter amplifier and said receiver amplifier to said antenna, wherein
   said signal processing unit controls operation of said switch.

3. The Pulse-Doppler radar apparatus according to claim 1, wherein said transmission and reception unit comprises:
   a transmitter amplifier for amplifying the transmitted signal and supplying the same to said antenna;
   a receiver amplifier for amplifying a signal derived from the reflected wave received by the antenna and outputting the corresponding received signal; and
   a circulator for selectively connecting one of said transmitter amplifier and said receiver amplifier to said antenna.

4. A Pulse-Doppler radar apparatus according to claim 1, wherein said transmission and reception unit comprises:

an amplifier for amplifying an input signal;

a two-input switch connected to an input of said amplifier and having two input terminals, one of the input terminals receiving the transmitted signal;

a two-output switch connected to an output of said amplifier and having two output terminals, one of the output terminals being connected to the second mixer; and a circulator connected to the other output terminal of said two-output switch, the other input terminal of said two-input switch and said antenna, and selectively connecting said antenna to one of: the other output terminal of said two-output switch; and the other input terminal of said two-input switch, wherein said signal processing unit controls operation of said two-input switch and two-output switch.

5. The Pulse-Doppler radar apparatus according to claim 1, wherein said signal processing unit changes the preset voltage for said oscillator with time so that said oscillator outputs a frequency-modulated high-frequency signal with its frequency varying in accordance with the preset voltage.

6. A Pulse-Doppler radar apparatus comprising:

an antenna;

an oscillator for outputting a high-frequency signal corresponding to a preset voltage;

a distributor connected to an output of said oscillator so as to divide the high-frequency signal into a first distributed signal and a second distributed signal;

a multiplier for directly receiving the first distributed signal and outputting a transmitted signal having twice the frequency as that of the first distributed signal;

a transmission and reception unit for outputting a pulse wave corresponding to the transmitted signal via the antenna and outputting a received signal based on a reflected wave derived from the pulse wave and received by said antenna;

a mixer supplied at one of its two input terminals with the second distributed signal, supplied at the other input terminal with the received signal, and outputting a baseband signal based on the second distributed signal and the received signal; and a signal processing unit outputting the preset voltage to said oscillator, and measuring at least one of a distance and speed of a target generating the reflected wave, based on the baseband signal.

7. The Pulse-Doppler radar apparatus according to claim 6, wherein said transmission and unit comprises:

a transmitter amplifier for amplifying the transmitted signal and supplying the same to said antenna;

a receiver amplifier for amplifying a signal derived from the reflected wave received by the antenna and outputting the corresponding received signal; and a switch for selectively connecting one of said transmitter amplifier and said receiver amplifier to said antenna, wherein said signal processing unit controls an operation of said switch.

8. The Pulse-Doppler radar apparatus according to claim 6, wherein said transmission and reception unit comprises:

a transmitter amplifier for amplifying the transmitted signal and supplying the same to said antenna;

a receiver amplifier for amplifying a signal derived from the reflected wave received by the antenna and outputting the corresponding received signal; and a circulator for selectively connecting one of said transmitter amplifier and said receiver amplifier to said antenna.

9. The Pulse-Doppler radar apparatus according to claim 6, wherein said transmission and reception unit comprises:

an amplifier for amplifying an input signal;

a two-input switch connected to an input of said amplifier and having two input terminals, one of the input terminals receiving the transmitted signal;

a two-output switch connected to an output of said amplifier and having two output terminals, one of the output terminals being connected to the mixer; and a circulator connected to the other output terminal of said two-output switch, the other input terminal of said two-input switch and said antenna, and selectively connecting said antenna to one of: the other output terminal of said two-output switch; and the other input terminal of said two-input switch, wherein said signal processing unit controls operation of said two-input switch and two-output switch.

10. The Pulse-Doppler radar apparatus according to claim 6, wherein said signal processing unit changes the preset voltage for said oscillator with time so that said oscillator outputs a frequency-modulated high-frequency signal with its frequency varying in accordance with the preset voltage.

* * * * *